(12) United States Patent
Finnerty et al.

(10) Patent No.: US 10,353,026 B2
(45) Date of Patent: Jul. 16, 2019

(54) MRI COIL FOR USE DURING AN INTERVENTIONAL PROCEDURE

(71) Applicants: Matthew Finnerty, University Heights, OH (US); Arne Hengerer, Möhrendorf (DE); Volker Matschl, Bamberg (DE); Gregory Weisberg, Cleveland, OH (US); Tsinghua Zheng, Chesterland, OH (US)

(72) Inventors: Matthew Finnerty, University Heights, OH (US); Arne Hengerer, Möhrendorf (DE); Volker Matschl, Bamberg (DE); Gregory Weisberg, Cleveland, OH (US); Tsinghua Zheng, Chesterland, OH (US)

(73) Assignees: SIEMENS AKTIENGESELLSCHAFT, München (DE); QUALITY ELECTRODYNAMICS (QED), Mayfield Village, OH (US)

(*) Notice: Subject to any disclaimer, the term of this patent is extended or adjusted under 35 U.S.C. 154(b) by 286 days.

(21) Appl. No.: 15/183,201

(22) Filed: Jun. 15, 2016

(65) Prior Publication Data
US 2016/0363641 A1     Dec. 15, 2016

Related U.S. Application Data

(60) Provisional application No. 62/180,029, filed on Jun. 15, 2015.

(51) Int. Cl.
*G01V 3/00*     (2006.01)
*G01R 33/3415*  (2006.01)
*G01R 33/34*    (2006.01)
*G01R 33/36*    (2006.01)

(52) U.S. Cl.
CPC ... *G01R 33/3415* (2013.01); *G01R 33/34007* (2013.01); *G01R 33/3678* (2013.01)

(58) Field of Classification Search
CPC .... G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/341; G01R 33/385; G01R 33/56358;
(Continued)

(56) References Cited

U.S. PATENT DOCUMENTS 6,433,548 B1 * 8/2002 Furuta ............. G01R 33/34053
324/318
7,394,256 B2 * 7/2008 Schubert .......... G01R 33/34046
324/307
(Continued)

*Primary Examiner* — Thang X Le
(74) *Attorney, Agent, or Firm* — Lempia Summerfield Katz LLC

(57) ABSTRACT

In order to provide interventional access during an image-guided interventional procedure, while increasing the signal-to-noise ratio for generated images compared to a single loop coil, a local coil includes a single coil element disposed around an opening through the local coil and two coil elements positioned on opposite sides of the single coil element. The opening provides access for an interventional tool used during the image-guided interventional procedure.

19 Claims, 4 Drawing Sheets

(58) Field of Classification Search
CPC ..... A61B 5/055; A61B 5/0555; A61B 5/7278; A61B 5/725
See application file for complete search history.

(56) References Cited

U.S. PATENT DOCUMENTS

| | | | | |
|---|---|---|---|---|
| 8,030,930 | B2* | 10/2011 | Li | G01R 33/34046 324/318 |
| 2003/0210049 | A1* | 11/2003 | Boskamp | G01R 33/3415 324/311 |
| 2005/0134271 | A1* | 6/2005 | Zheng | G01R 33/3415 324/318 |
| 2008/0157772 | A1* | 7/2008 | Okamoto | G01R 33/3415 324/322 |
| 2009/0030305 | A1* | 1/2009 | Hoogeveen | G01R 33/3621 600/422 |
| 2016/0041239 | A1* | 2/2016 | Piron | G01R 33/565 324/322 |
| 2016/0054404 | A1* | 2/2016 | Duensing | G01R 33/34046 324/309 |
| 2016/0077172 | A1* | 3/2016 | Duensing | G01R 33/34007 600/422 |

* cited by examiner

MRI COIL FOR USE DURING AN INTERVENTIONAL PROCEDURE

This application claims the benefit of U.S. Provisional Patent Application No. 62/180,029, filed on Jun. 15, 2015, which is hereby incorporated by reference in its entirety.

FIELD

The present embodiments relate to a magnetic resonance imaging (MRI) coil used during an interventional procedure.

BACKGROUND

For interventional applications such as, for example, biopsy of a hip or a shoulder, disposable components may be used. For magnetic resonance imaging (MRI) during an interventional procedure, however, MRI coils (e.g., local coils) may include a number of electrical devices including, for example, preamplifiers, traps, combiners, matching and detuning circuits, or any combination thereof, and may thus be too expensive to throw away after use with a particular patient. Conventional MRI coils such as, for example, loop coils or body array coils are placed in a sterile plastic bag with an opening in the middle for interventional access, and are positioned on a patient to be imaged and on which the interventional procedure is to be performed.

SUMMARY

In order to provide interventional access during an image-guided interventional procedure, while increasing the signal-to-noise ratio for generated images compared to a single loop coil, a local coil includes a single coil element disposed around an opening through the local coil and two coil elements positioned on opposite sides of the single coil element. The opening provides access for an interventional tool used during the image-guided interventional procedure.

In a first aspect, an MRI coil includes a first coil element and at least one second coil element. The MRI coil also includes a housing supporting the first coil element and the at least one second coil element. The housing includes a top, a bottom, and an opening. The opening extends from the top to the bottom, through the housing. The housing supports the first coil element, such that the first coil element at least partially surrounds the opening through the housing.

In a second aspect, a system for receiving signals from an object under investigation is provided. The system includes an MRI coil including a loop coil and a butterfly coil. The system also includes a housing. The housing includes a top, a bottom, and an opening. The opening extends from the top to the bottom, through the housing. The loop coil and the butterfly coil are positioned within and supported by the housing. The MRI coil also includes a connector in communication with the loop coil and the butterfly coil. The system includes an interface including a preamplifier, traps, combiners, matching and detuning circuits, or any combination thereof. The connector is in communication with the interface. The interface is configured to communicate with an MRI scanner.

In a third aspect, a method for imaging an object under investigation during an interventional procedure on the object under investigation is provided. The method includes positioning an MRI coil on the object under investigation. The MRI coil includes a first coil element and at least one second coil element, and a housing supporting the first coil element and the at least one second coil element. The housing includes a top, a bottom, and an opening. The opening extends from the top to the bottom, through the housing. The housing supports the first coil element, such that the first coil element at least partially surrounds the opening through the housing. The method also includes receiving signals from the object under investigation via the MRI coil while an interventional procedure is performed on the object under investigation.

DETAILED DESCRIPTION

One or more of the present embodiments combine the advantages of a high performance magnetic resonance (MR) coil and a disposable MR coil that is developed for interventional applications. This coil may be used with a plastic bag (not necessarily sterile) with an opening in the middle for interventional access.

Electronics such as, for example, a preamplifier, traps, combiners, and matching and detuning circuits are located outside the disposable coil in a separate interface that may be connected to an MRI scanner. The interface and the disposable coil are detachable, so that the disposable coil (e.g., a housing including coil elements) is as cheap as possible to produce.

The disposable coil includes a housing, in which a combination of a loop/butterfly loop arrangement is positioned to form a circular polarized antenna. The disposable coil provides an approach for interventional access. The housing is made of foam and includes a 15-20 cm opening in the middle. A 15-20 cm loop element is positioned around the opening. The housing also includes two outer wings with additional loop elements. The signals of the three loops are combined inside the interface.

One signal of the three signals may allow a 1.4 times higher signal-to-noise ratio than a single loop design. Two signals (e.g., circular polarized (CP) and reverse CP) may be used for possible parallel acquisition techniques (e.g., still 1.4 times higher signal-to-noise ratio).

Figure 1:
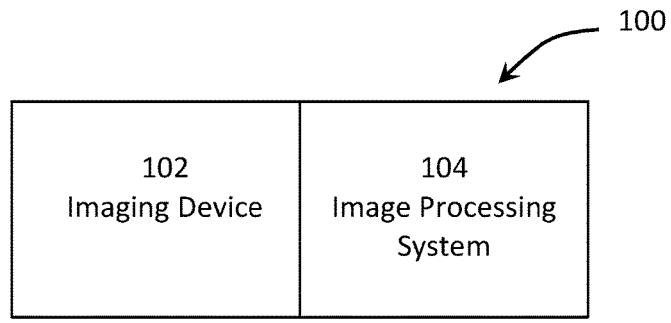
FIG. 1 shows one embodiment of an imaging system.

FIG. 1 shows one embodiment of an image-guided therapy system 100 (e.g., a therapy system). The image-guided therapy system 100 may be used in the system and method described below. The therapy system 100 may include one or more imaging devices 102 (e.g., an imaging device) and one or more image processing systems 104 (e.g., an image processing system). A dataset representing a two-dimensional (2D) or a three-dimensional (3D) (e.g., volumetric) region may be acquired using the imaging device 102 and the image processing system 104 (e.g., an imaging system). The 2D dataset or the 3D dataset may be obtained contemporaneously with the planning and/or execution of a medical treatment procedure or at an earlier time. Additional, different or fewer components may be provided.

In one embodiment, the imaging system 102, 104 is, for example, an MRI system. The imaging system 102, 104 may be used to create a patient model that may be used in the planning and/or execution of a medical treatment procedure (e.g., biopsy of a hip or shoulder of a patient). For example, the image processing system 104 is a workstation for an image-guided interventional procedure. In other embodiments, the imaging system 102, 104 may include, for example, a medical workstation, a computed tomography (CT) system, an ultrasound system, a positron emission tomography (PET) system, an angiography system, a fluoroscopy, an x-ray system, any other now known or later developed imaging system, or a combination thereof. The workstation 104 receives data representing or images of the patient (e.g., including at least part of the hip or the shoulder) generated by the imaging device 102.

Figure 2:
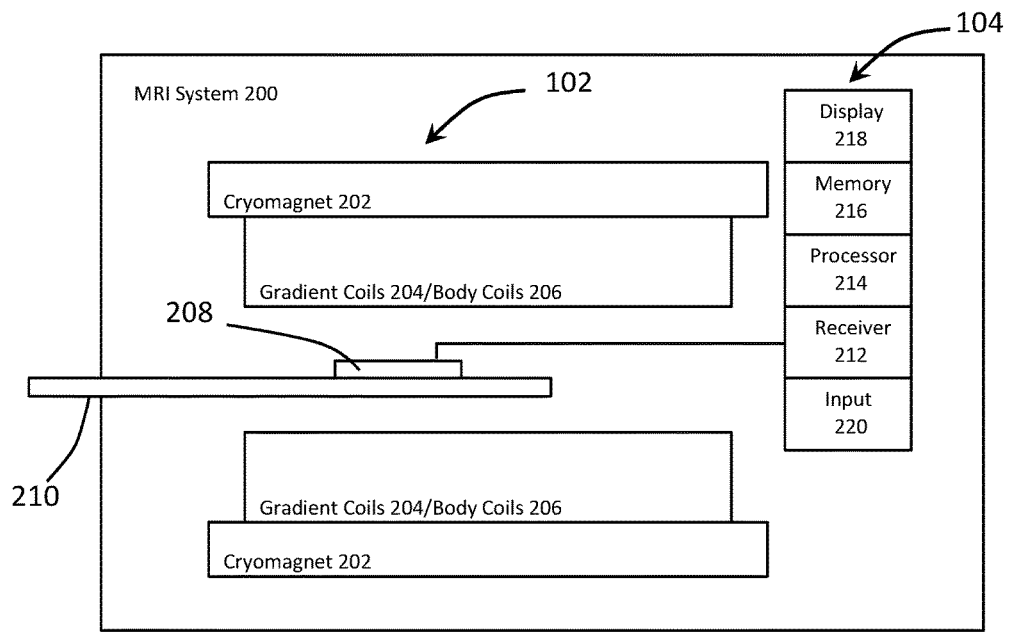
FIG. 2 shows an imaging system including one embodiment of an imaging device.

FIG. 2 shows one embodiment of an MRI system 200. The MRI system 200 includes an MRI device 102 and the image processing system 104. The MRI device 102 includes a cryomagnet 202, gradient coils 204, a whole body coil 206 (e.g., body coils), a local coil 208, and a patient bed 210. The image processing system 104 may include an MR receiver 212, a processor 214, a memory 216, and a display 218. Additional, different, or fewer components may be provided. For example, an additional local coil or an additional surface coil may be provided for MR imaging. Additionally, a user input device 220 (e.g., a keyboard and/or a mouse) may be provided for user control. As another example, the local coil 208 or the whole body coil 206 is not provided.

Other parts of the MRI system 200 are provided within a same housing, within a same room (e.g., within a radio frequency cabin), within a same facility, or connected remotely. The other parts of the MRI system 200 may include cooling systems, pulse generation systems, additional image processing systems, and user interface systems. Any now known or later developed MR imaging system may be used. The location of the different components of the MRI system 200 is within and/or outside the RF cabin, such as the image processing, tomography, power generation, and user interface components being outside the RF cabin. Power cables, cooling lines, and communication cables connect the pulse generation, magnet control, and detection systems within the RF cabin with the components outside the RF cabin through a filter plate.

In one embodiment, the processor 214 and the memory 216 are part of the MR receiver 212. Alternatively, the processor 214 and the memory 216 are part of an archival and/or image processing system, such as associated with a medical records database workstation or server. In yet other embodiments, the processor 214 and the memory 216 are a personal computer such as a desktop or a laptop, a workstation, a server, a network, or combinations thereof. The processor 214 and the memory 216 may be provided without other components for implementing the method.

The cryomagnet 202, the gradient coils 204, and the body coils 206 are in the RF cabin, such as a room isolated by a Faraday cage. A tubular or laterally open examination subject bore encloses a field of view. A more open arrangement may be provided. The patient bed 210 (e.g., a patient gurney or table) supports an examination subject such as, for example, a patient with a local coil arrangement, including the local coil 208. The patient bed 210 may be moved into the examination subject bore in order to generate images of the patient. In the embodiment shown in FIG. 2, the local coil 208 is located on the patient bed 210 (e.g., below a patient). In other embodiments, the local coil 208 may be located between the patient bed 210 and the patient, on a side of the patient, and/or above the patient (e.g., on the patient), for example. Received signals may be transmitted by the local coil 208 to the MR receiver 212 via, for example, coaxial cable or radio link (e.g., via antennas) for imaging. In one embodiment, the receiver 212 is an interface separate from the other components of the image processing system 104, and the receiver 212 processes signals received by the local coil 208 and transmits the processed signals to a separate receiver of the image processing system 104.

In order to examine the patient, different magnetic fields are temporally and spatially coordinated with one another for application to the patient. The cryomagnet 202 generates a strong static main magnetic field $B_0$ in the range of, for example, 0.2 Tesla to 3 Tesla or more. The main magnetic field $B_0$ is approximately homogenous in the field of view.

The nuclear spins of atomic nuclei of the patient are excited via magnetic radio-frequency excitation pulses that are transmitted via a radio-frequency antenna, which is shown in FIG. 2 in simplified form as a whole body coil 206 and/or possibly a local coil arrangement (e.g., the local coil 208 or local coils). Radio-frequency excitation pulses are generated, for example, by a pulse generation unit controlled by a pulse sequence control unit. After being amplified using a radio-frequency amplifier, the radio-frequency excitation pulses are routed to the body coils 206, the local coils 208, and/or another coil. Each of the body coils 206 is a single-part or includes multiple coils. The signals are at a given frequency band. For example, the MR frequency for a 3 Tesla system is about 123 MHz+/−500 kHz. Different center frequencies and/or bandwidths may be used.

The gradient coils 204 radiate magnetic gradient fields in the course of a measurement in order to produce selective layer excitation and for spatial encoding of the measurement signal. The gradient coils 204 are controlled by a gradient control unit that, like the pulse generation unit, is connected to the pulse sequence control unit. The gradient control unit, the pulse generation unit, and/or the pulse sequence control unit are represented, at least in part, by the processor 214 or another controller.

Signals emitted as a result of the excited nuclear spins are received by the local coil 208. In some MR tomography procedures, images having a high signal-to-noise ratio (SNR) may be formed using the local coil arrangement (e.g., loops, local coils). The local coil arrangement (e.g., antenna systems) is disposed in the immediate vicinity of the examination subject on (anterior), under (posterior) or in the patient. The received signals are amplified by associated radio-frequency preamplifiers, transmitted in analog or digitized form, and processed further and digitized by the MR receiver 212. In the embodiment where the MRI receiver 212 is an interface separate from the image processing system 104, the interface 212 includes, for example, a preamplifier, traps, combiners, matching and detuning circuits, other electronic devices, or any combination thereof. The interface 212 processes (e.g., amplifies) the received signals, and transmits the processed signals to the image processing system 104. The digitized data is stored in the memory 216 as complex numeric values in a k-space matrix. An associated MR image of the examination subject may be reconstructed using a one-dimensional or a multidimensional Fourier transform (FT) from the k-space matrix populated with values. Reconstructed MR images of the examination subject may be stored in the memory 216 and/or displayed on the display 218.

The local coil 208 is conductive. For example, the local coil 208 is made of copper. The local coil 208 is used as a receive antenna. Any size coil may be used. Non-symmetric size may be provided. The local coil 208 may be a surface coil or a solenoid coil. Other local coil geometries may be provided.

The local coil 208 connects with the MR receiver 212 (e.g., the interface). The connection is wired (e.g., using a coaxial cable) or wireless. The connection is for data from the local coil 208 to be transmitted to and received by the MR receiver 212. In one embodiment, the data is K-space data, and in response to an MR pulse, the local coil 208 receives signals and transmits the K-space data to the MR receiver 212. Any pulse sequence, such as a simple pulse sequence acquiring projections along three spatial axes, may be used. Any spatial resolution may be provided (e.g., a spatial resolution of 3 mm).

In one embodiment, the MR receiver 212 includes the processor 214 or another processor (e.g., a digital signal processor, a field programmable gate array, or an application specific circuit for applying an inverse Fourier transform) for reconstructing the K-space data. The MR receiver 212 is configured by hardware or software to calculate X, Y, and Z projection data from the K-space data.

In the course of an MR measurement, the excited nuclei induce a voltage in the local coil 208. The induced voltage is, for example, transmitted to the MR receiver 212 and amplified by a low-noise preamplifier (e.g., LNA, preamp) of the MR receiver 212. Other transforms for reconstructing spatial data from the K-space data may be used.

The processor 214 is a general processor, a central processing unit, a control processor, a graphics processor, a digital signal processor, a three-dimensional rendering processor, an image processor, an application-specific integrated circuit, a field-programmable gate array, a digital circuit, an analog circuit, combinations thereof, or other now known or later developed device for image processing. The processor is a single device or multiple devices operating in serial, parallel, or separately. The processor 214 may be a main processor of a computer, such as a laptop or desktop computer, or may be a processor for handling some tasks in a larger system, such as being part of the MR receiver 212 or the imaging system 104. The processor 214 is configured by instructions, design, hardware, and/or software to perform the acts discussed herein, such as guiding an interventional device (e.g., a biopsy needle).

The memory 216 is a computer readable storage media. The computer readable storage media may include various types of volatile and non-volatile storage media, including but not limited to random access memory, read-only memory, programmable read-only memory, electrically programmable read-only memory, electrically erasable read-only memory, flash memory, magnetic tape or disk, optical media and the like. The memory 216 may be a single device or a combination of devices. The memory 216 may be adjacent to, part of, networked with and/or remote from the processor 214.

The display 218 is a monitor, a CRT, an LCD, a plasma screen, a flat panel, a projector or other now known or later developed display device. The display 218 is operable to generate images for a two-dimensional view or a rendered three-dimensional representation. For example, a two-dimensional image representing a three-dimensional volume through rendering is displayed.

Figure 3:
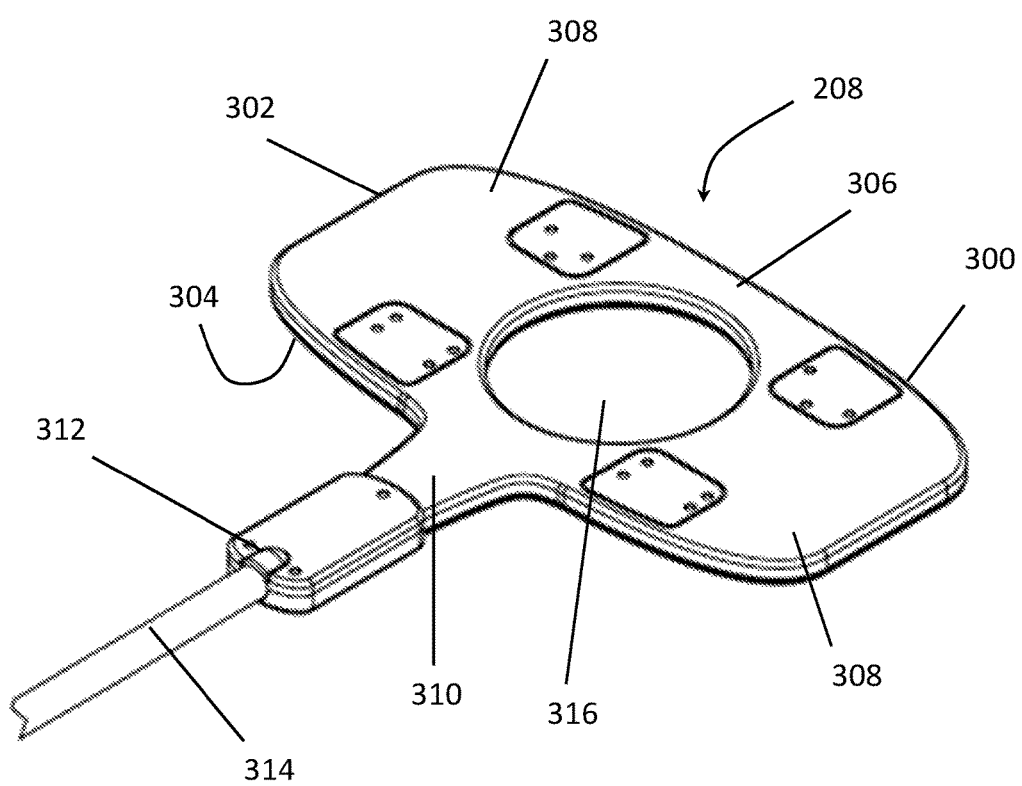
FIG. 3 shows one embodiment of a local coil.

FIG. 3 shows one embodiment of the local coil 208 of FIG. 2. The local coil 208 includes a housing 300 having a top 302 and a bottom 304. The local coil 208 includes a central part 306 and wings 308 on opposite sides of the central part 306. The wings 308 extend in opposite directions away from the central part 306. The overall shape of the combination of the central part 306 and the wings 308 is rounded rectangular. The local coil 208 may be any number of other shapes including, for example, circular or elliptical.

The housing 300 may be flat and flexible. For example, the housing 300 may be 1 cm thick across the entire housing 300.

The local coil 208 also includes an additional extension 310 extending away from central part 306. The additional extension 310 includes a connector 312, to which a cable 314 (e.g., a coaxial cable) is connectable. The connector 312 may be a connector for a coaxial cable for transmitting received data (e.g., to the interface 212). In one embodiment, the connector 312 includes pins for tuning, detuning, power consumption, etc.

The housing 300 includes an opening 316 through which an interventional procedure such as, for example, a biopsy may be performed. The opening 316 extends from the top 302 to the bottom 304 of the housing 300, through the housing 300. The opening 316 may be any number of shapes. For example, the opening 316 is circular in shape.

The housing 300 may be made of any number of MRI-safe materials. For example, the housing 300 may be a foam housing. In one embodiment, the housing 300 is made of EVAZOTE® foam. The housing 300 may be made of additional and/or different materials (e.g., other plastics).

Figure 4:
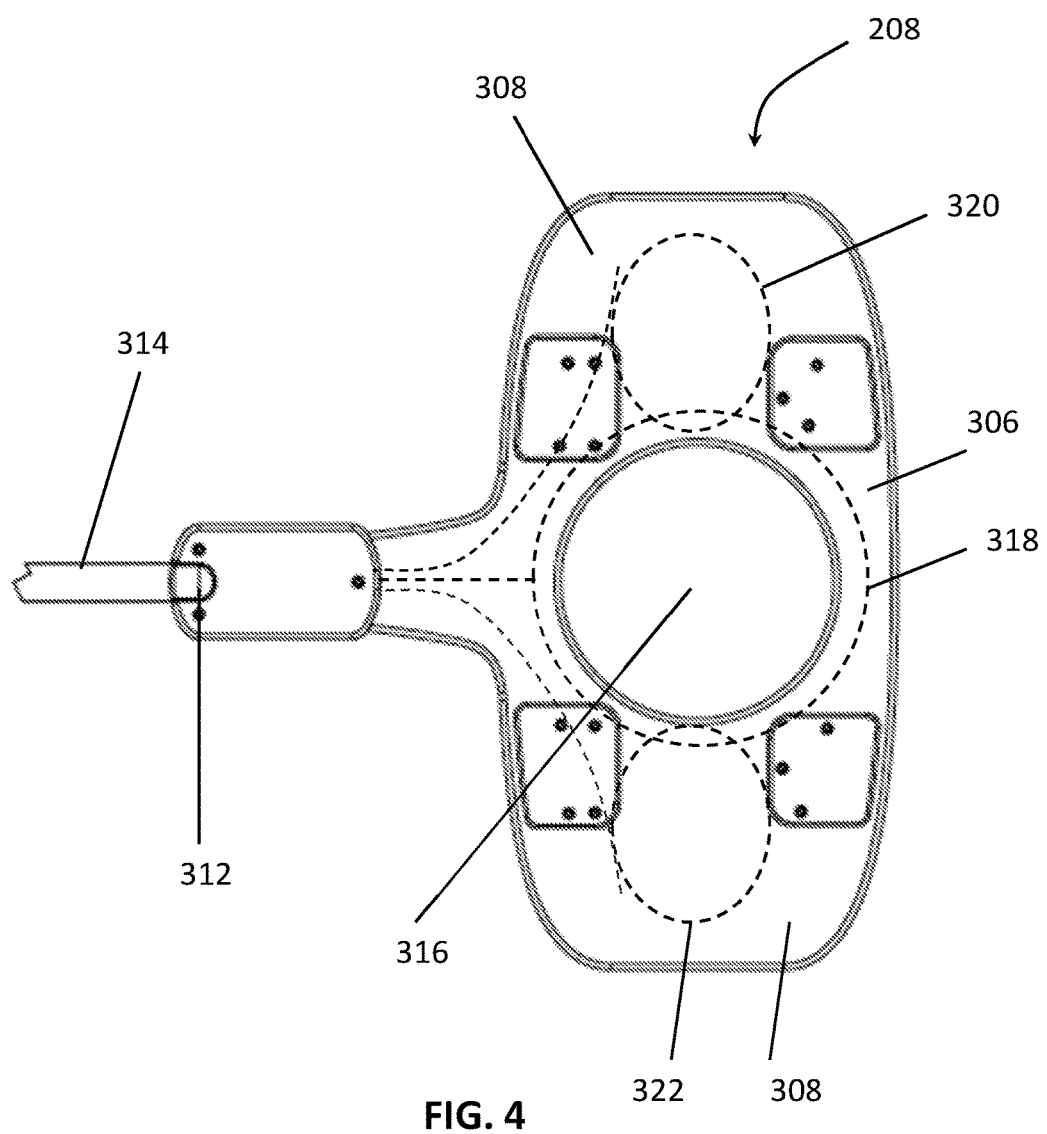
FIG. 4 shows a top view of the local coil of FIG. 3.

FIG. 4 shows a top view of the local coil 208 of FIG. 3. The opening 316 may have any number of dimensions including, for example, a diameter of 15-20 cm. Due to wavelength considerations, the minimum size of the opening 316 may be 15 cm. If a sterile operating field is to be provided, the larger opening having a diameter of 15-20 cm may be provided.

In one embodiment, the local coil 208 includes a cover (e.g., a plastic cover) at least partially surrounding the housing 300 of the local coil 208. The plastic cover may include an opening corresponding to the opening 316 through the housing 300 to allow for the interventional procedure. The plastic cover may be a plastic bag and may not be sterile. In one embodiment, the local coil 208 does not include the housing 300, and the plastic cover at least partially surrounds the local coil.

In one embodiment, the local coil 208 is a circular polarized receiving coil. The circular polarized coil 208 includes an open loop coil element at least partially within the central part 306 of the housing 300 (e.g., a middle element 318), and loop coil elements (e.g., two loop coil elements; a left element 320, and a right element 322) at least partially in the wings 308, respectively. The local coil 208 may include more or fewer coil elements. For example, the local coil 208 may include only the middle element 318. In one embodiment, the open loop coil element in the central part 306 forms a loop coil, and the loop coil elements in the wings 308 form, for example, a butterfly coil.

The loop coil element within the central part 306 of the housing 300 at least partially surrounds the opening 316. In one embodiment, the loop coil element within the central part 306 of the housing 300 thus has a diameter of 15-20 cm (e.g., 18 cm). In one embodiment, the diameter of the loop coil elements in the wings 308 is smaller than the diameter of the loop coil element in the central part 306 of the housing 300. The smaller size of the loop coil elements in the wings 308 may be driven by cost and handling concerns.

The coil element within the central part 306 and the coil elements within the wings 308 may be formed on a printed circuit board (PCB) positioned within the housing 300. The PCB may be made of any number of materials including, for example, fiberglass (e.g., FR-4).

The PCB positioned within the housing 300 may include electronic devices for further processing the received signals. For example, an adjustment circuit, wave traps, other electronic devices, or a combination thereof may be electrically connected to the coil element within the central part 306 and the coil elements within the wings 308 via the PCB. In one embodiment, the number of electronic devices disposed within the local coil 208 is minimized to keep cost low compared to local coils of the prior art that include, for example, preamplifiers. In one embodiment, the cost for producing the local coil is less than $100.

The coil element within the central part 306 and the coil elements within the wings 308 are electrically connected to the connector 312 via the PCB and/or wires. The connector 312 is connectable to the cable 314, which leads to the interface 212 or the image processing system 104. The removable connection between the local coil 208 and the interface 212, for example, facilitates the local coil 208 being disposable. The interface 212 includes a number of electronic devices that may be found within a local coil of the prior art. For example, the interface 212 may include a preamplifier, traps, combiners, matching and detuning circuits, other electronic devices, or a combination thereof. Inclusion of such electronic devices within the local coil 208 would increase the cost of producing the local coil.

In one embodiment, the local coil 208 or the interface 212 includes a 90 degree combiner for combining signals received by the coil element of the central part 306 and the coil elements of the wings 308, such that the local coil 208 is a circular polarized coil (e.g., a circular polarized RX-loop antenna). One signal received from the circular polarized coil allows, for example, a 1.4 (e.g., square root of two) times higher signal-to-noise ratio than a single loop design. Two signals (e.g., circular polarized and reverse circular polarized) allow for parallel acquisition techniques. For example, acquisition time may be decreased (e.g., acceleration factor of two) based on the number of coil elements in the x-direction within the housing 300. In one embodiment, the middle element 318, the left element 320, and the right element 322 may be combined via a hardware or a software combiner in order to receive the circular polarized RX-signal. If the combination is already in the local coil 208 or the interface 212, only one RX channel may be needed (e.g., and one cable). In such a configuration, however, other information is missing, and protocols that use a parallel acquisition technique (PAT) may not be run. PAT-protocols use the information of each individual element (or the corresponding modes). If all elements (e.g., the middle element, the left element 320, and the right element 322) are read out individually, the SNR in close proximity to local coil 208 is increased due to a circular polarized antenna being optimized for only one region of interest (ROI).

Figure 5:
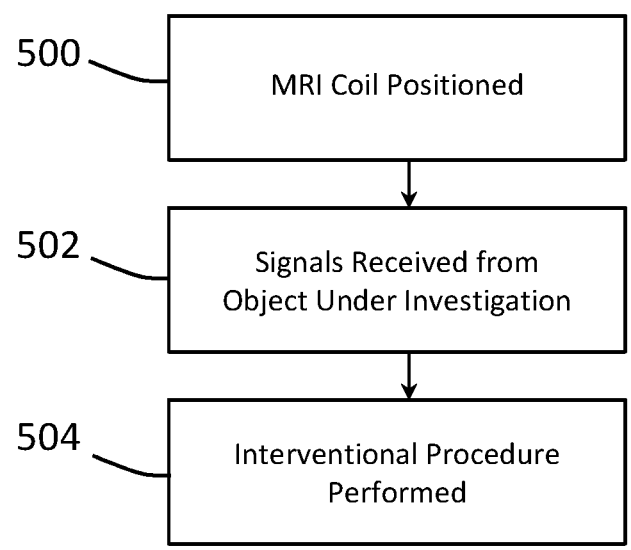
FIG. 5 shows a flowchart of one embodiment of a method for using a local coil in an interventional procedure.

FIG. 5 shows a flowchart of one embodiment of a method for imaging an object under investigation (e.g., a patient) during an interventional procedure on the object under investigation. The method may be performed using the imaging system 100 shown in FIGS. 1 and 2 or another imaging system, and using the local coil 208 of FIGS. 2-4 or another local coil. The method is implemented in the order shown, but other orders may be used. Additional, different, or fewer acts may be provided. Similar methods may be used for using a local coil during an interventional procedure.

In act 500, an MRI coil is positioned on the object under investigation. The object under investigation may, for example, be a patient. The MRI coil includes a first coil element and at least one second coil element. In one embodiment, the at least one second coil element includes two coil elements. The MRI coil also includes a housing supporting the first coil element and the at least one second coil element. The housing includes a top, a bottom, and an opening. The opening extends from the top to the bottom, through the housing. The housing supports the first coil element, such that the first coil element at least partially surrounds the opening through the housing.

In act 502, signals are received from the object under investigation via the MRI coil. In one embodiment, the first coil element and the two second coil elements receive signals from the patient in response to a circular polarized excitation provided by an MRI system. The MRI coil may transmit the received signals, further processed or unprocessed, to an interface via a connector of the MRI coil and a cable (e.g., a coaxial cable), for example. The interface includes electronic devices typically included in an MRI coil of the prior art. For example, the interface includes a preamplifier, traps, combiners, matching and detuning circuits, a combiner, other electronic devices for processing the received signals, or a combination thereof. In one embodiment, the combiner (e.g., within the interface) combines the signals from the first coil element and the two second coil elements into one signal or two signals. The one combined signal allows a 1.4 times higher signal-to-noise ratio than a single loop design. The two combined signals (e.g., a circular polarized signal and a reverse circular polarized signal) allow for possible parallel acquisition techniques (e.g., still with 1.4 times higher SNR).

In act 504, an interventional procedure is performed on the object under investigation while signals are received from the object under investigation. The interventional procedure is performed through the opening in the housing. For example, the interventional procedure includes performing a biopsy through the opening in the housing. A biopsy needle may extend through the opening during the biopsy procedure. The biopsy may be a biopsy of, for example, a shoulder or a hip of the patient.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance imaging (MRI) coil comprising:
   a first coil element and at least one second coil element, a second coil element of the at least one second coil element being a butterfly coil element; and
   a housing supporting the first coil element and the at least one second coil element, the housing comprising a top, a bottom, an opening, a central portion, and two wings extending away from the central portion, the opening extending from the top to the bottom, through the central portion of the housing,
   wherein the housing supports the first coil element, such that the first coil element at least partially surrounds the opening through the housing, and
   wherein the first coil element is at least partially positioned within the central portion of the housing, and the at least one second coil element is at least partially positioned within the two wings of the housing.

2. The MRI coil of claim 1, wherein the at least one second coil element comprises two second coil elements, the second coil element being one of the two second coil elements, the two second coil elements forming a butterfly arrangement.

3. The MRI coil of claim 2, wherein the first coil element and the two second coil elements are arranged within the housing such that the first coil element and the two second coil elements form a circular polarized MRI coil.

4. The MRI coil of claim 2, wherein the housing supports the two second coil elements such that the two second coil elements are disposed on opposite sides of the first coil element.

5. The MRI coil of claim 1, wherein the opening has a diameter of 15-20 cm.

6. The MRI coil of claim 5, wherein a diameter of the at least one second coil element is smaller than the diameter of the first coil element.

7. The MRI coil of claim 1, further comprising a connector electrically connected to the first coil element and the at least one second coil element, wherein the housing supports the connector.

8. The MRI coil of claim 7, wherein the connector is in communication with an interface comprising a preamplifier, traps, combiners, matching and detuning circuits, or any combination thereof, the interface being located outside of the housing.

9. The MRI coil of claim 1, wherein the housing is flexible.

10. The MRI coil of claim 1, wherein the housing is made of a disposable plastic.

11. A system for receiving signals from an object under investigation, the system comprising:
a magnetic resonance imaging (MRI) coil comprising:
a loop coil and a butterfly coil;
a housing comprising a top, a bottom, an opening, a central portion, and two wings extending away from the central portion, the opening extending from the top to the bottom, through the central portion of the housing, the loop coil and the butterfly coil being positioned within and supported by the housing; and
a connector in communication with the loop coil and the butterfly coil; and
an interface comprising a preamplifier, traps, combiners, matching and detuning circuits, or any combination thereof,
wherein the connector is in communication with the interface, the interface being configured to communicate with an MRI scanner, and
wherein the loop coil is at least partially positioned within the central portion of the housing, and the butterfly coil is at least partially positioned within the two wings of the housing.

12. The system of claim 11, wherein the connector of the MRI coil is physically and electrically connectable to the interface via a coaxial cable.

13. The system of claim 11, wherein the butterfly coil comprises two coil elements positioned on opposite sides of the loop coil.

14. The system of claim 11, wherein the MRI coil further comprises a ninety degree combiner in communication with the loop coil and the butterfly coil.

15. The system of claim 11, wherein the loop coil and the butterfly coil are configured to receive signals from an object under investigation,
wherein the MRI coil is configured to transmit the received signals to the interface via the connector, and
wherein the interface is configured to combine the received signals.

16. The system of claim 11, wherein the housing is made of a foam.

17. A method for imaging an object under investigation during an interventional procedure on the object under investigation, the method comprising:
positioning a magnetic resonance imaging (MRI) coil on the object under investigation, the MRI coil comprising a first coil element and at least one second coil element, a second coil element of the at least one second coil element being a butterfly coil, and a housing supporting the first coil element and the at least one second coil element, the housing comprising a top, a bottom, an opening, a central portion, and two wings extending away from the central portion, the opening extending from the top to the bottom, through the central portion of the housing, wherein the housing supports the first coil element, such that the first coil element at least partially surrounds the opening through the housing, and wherein the first coil element is at least partially positioned within the central portion of the housing, and the at least one second coil element is at least partially positioned within the two wings of the housing; and
receiving signals from the object under investigation via the MRI coil while an interventional procedure is performed on the object under investigation.

18. The method of claim 17, wherein the interventional procedure is performed through the opening in the housing.

19. The method of claim 17, further comprising transmitting the received signals to an interface via a connector of the MRI coil, the interface comprising a preamplifier, traps, combiners, matching and detuning circuits, or any combination thereof.

* * * * *